US009249017B2

(12) United States Patent
Korgel et al.

(10) Patent No.: US 9,249,017 B2
(45) Date of Patent: Feb. 2, 2016

(54) NANOWIRES AND METHODS OF MAKING AND USING

(75) Inventors: Brian A. Korgel, Round Rock, TX (US); Chet Steinhagen, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 55 days.

(21) Appl. No.: 13/704,331

(22) PCT Filed: Jul. 8, 2011

(86) PCT No.: PCT/US2011/043314
§ 371 (c)(1),
(2), (4) Date: Mar. 13, 2013

(87) PCT Pub. No.: WO2012/009212
PCT Pub. Date: Jan. 19, 2012

(65) Prior Publication Data
US 2013/0206232 A1    Aug. 15, 2013

Related U.S. Application Data

(60) Provisional application No. 61/363,484, filed on Jul. 12, 2010.

(51) Int. Cl.
*H01L 31/00* (2006.01)
*B82Y 30/00* (2011.01)
*B82Y 20/00* (2011.01)
(Continued)

(52) U.S. Cl.
CPC ............... *B82Y 30/00* (2013.01); *B82Y 20/00* (2013.01); *B82Y 40/00* (2013.01); *C01B 19/002* (2013.01); *C01B 19/007* (2013.01); *H01L 31/0322* (2013.01); *H01L 31/035209* (2013.01); *H01L 31/035227* (2013.01); *H01L 31/0749* (2013.01); *H01L 31/18* (2013.01); *C01P 2002/30* (2013.01); *C01P 2002/54* (2013.01); *C01P 2002/72* (2013.01); *C01P 2004/03* (2013.01); *C01P 2004/04* (2013.01); *C01P 2004/16* (2013.01); *Y02E 10/541* (2013.01)

(58) Field of Classification Search
CPC ............... H01L 31/0322; H01L 31/035227; B82Y 30/00; B82Y 20/00; Y02E 10/541
USPC .................. 136/252, 255, 260, 262, 264, 265; 977/762
See application file for complete search history.

(56) References Cited

U.S. PATENT DOCUMENTS

| 5,500,056 A | * | 3/1996 | Wada et al. .................. 136/259 |
| 2005/0215079 A1 | * | 9/2005 | Taunier et al. ................ 438/796 |

(Continued)

OTHER PUBLICATIONS

Peng et al. "Synthesis and phase transformation of In2Se3 and CuInSe2 nanowires". 2006. JACS.*

(Continued)

*Primary Examiner* — Jonathan Johnson
*Assistant Examiner* — Lindsey Bernier
(74) *Attorney, Agent, or Firm* — Ballard Spahr LLP

(57) ABSTRACT

Nanorod and nanowire compositions are disclosed comprising copper indium selenide, copper indium gallium selenide, copper indium sulfide, or a combination thereof. Also disclosed are photovoltaic devices comprising the nanorod and/or nanowire compositions. Also disclosed are methods for producing the nanorod and nanowire compositions, and photovoltaic devices described herein.

15 Claims, 5 Drawing Sheets

(51) Int. Cl.
*B82Y 40/00* (2011.01)
*C01B 19/00* (2006.01)
*H01L 31/032* (2006.01)
*H01L 31/0352* (2006.01)
*H01L 31/0749* (2012.01)
*H01L 31/18* (2006.01)

(56) References Cited

U.S. PATENT DOCUMENTS

2006/0197064 A1* 9/2006 Pan et al. ............... 252/500
2008/0135089 A1* 6/2008 Tsakalakos et al. ......... 136/248
2011/0048522 A1* 3/2011 Chuang ............... H01L 31/0322
136/256

OTHER PUBLICATIONS

Conner et al. "Phase transformation of biphasic Cu2S-CuInSe2 to monophasic CuInS2 nanorods". 2009. JACS.*
Meyer et al. Spectral dependence and hall effects of persistent photoconductivity in polycrystalline Cu(In,Ga)Se2 thin films. 2002. Journal of applied physics.*
Kwak W, et al. (2009) Template-free liquid-phase synthesis of high-density CdS nanowire arrays on conductive glass. J. Phys. Chem. C. 113: 1615-1619.
Peng H, et al. (2007) Synthesis and phase transformation of In2Se3 and CuInSe2 nanowires. J. Am. Chem. Soc. 129: 34-35.
Wooten AJ, et al. (2009) Solution-liquid-solid growth of ternary Cu-In-Se semiconductor nanowires from multiple- and single-source precursors. J. Am. Chem. Soc. 131: 16177-16188.
International Preliminary Report on Patentability issued Jan. 15, 2013 by the International Searching Authority for International Patent Application PCT/US2011/043314 filed Jul. 9, 2011 and which published as WO 2012/009212 on Jan. 19, 2012 (Inventor—Brian Korgel // Applicant—Board of Regents of the University of Texas System) (6 pages).
International Search Report issued Feb. 29, 2012 by the International Searching Authority for International Patent Application PCT/US2011/043314 filed Jul. 9, 2011 and which published as WO 2012/009212 on Jan. 19, 2012 (Inventor—Brian Korgel // Applicant—Board of Regents of the University of Texas System) (4 pages).
Written Opinion issued Feb. 27, 2012 by the International Searching Authority for International Patent Application PCT/US2011/043314 filed Jul. 9, 2011 and which published as WO 2012/009212 on Jan. 19, 2012 (Inventor—Brian Korgel // Applicant—Board of Regents of the University of Texas System) (5 pages).

* cited by examiner

NANOWIRES AND METHODS OF MAKING AND USING

CROSS-REFERENCE TO RELATED APPLICATIONS

The present application is a U.S. National Phase Application of International Application No. PCT/US2011/043314, filed Jul. 8, 2011, which claims priority to U.S. Patent Application No. 61/363,484, filed Jul. 12, 2010, all of which applications are incorporated herein fully by this reference.

BACKGROUND

1. Technical Field

The present disclosure relates to nanomaterials, and specifically to copper indium selenide (CIS) nanorods and nanowires, and methods for making and using such nanorods and nanowires.

2. Technical Background

Copper indium selenide ($CuInSe_2$; CIS) and related materials can be useful as light absorbing materials in, for example, photovoltaic (PV) devices. In photovoltaic devices, these materials can be useful due to their match to the solar spectrum and high optical absorption coefficients. The efficiency of most single junction thin-film solar cells is limited, and even those employing a CIS absorber layer can have a solar energy conversion of about 20% or less. CIS can exhibit good long-term stability that can improve with time. CIS films for photovoltaics are currently deposited onto substrates by a coevaporation process, in which copper, indium, and gallium metal are first deposited, then reacted with Se vapor or $H_2Se$ to convert the deposited materials to CIS. This deposition approach can be expensive and the CIS stoichiometry can be difficult to control when trying to deposit the films over large areas.

Solution-based methods have been developed to synthesize colloidal nanocrystals of many different materials, including metals, and Group II-VI, III-V, I-VI, and IV semiconductors. Colloidal CdSe and CdTe nanocrystals have been used to form functional photovoltaic devices with reasonable light energy conversion efficiencies; however, many Group II-VI semiconductors that would be useful for photovoltaic devices, such as CdTe for example, contain toxic Pb, Cd, and Hg, which make them undesirable for widespread commercialization.

Synthetic procedures for preparing colloidal $CuInSe_2$ and CIGS nanocrystals have been reported in the literature, but these procedures typically have low yield and produce particles having multiple phases. The performance of traditional nanocrystal solar cells can also be inhibited by the high number of interfaces present in the material. Thus, there is a need to address the aforementioned problems and other shortcomings associated with traditional CIS synthesis and their incorporation into devices. These needs and other needs are satisfied by the compositions and methods of the present disclosure.

SUMMARY

In accordance with the purpose(s) of the invention, as embodied and broadly described herein, this disclosure, in one aspect, relates to nanoparticle materials, such as, for example, nanowires comprising copper indium selenide, copper indium gallium selenide, and copper indium sulfide (CIS/CIGS nanoparticles), methods of making nanoparticle materials, and to the use of the above mentioned nanoparticles in devices, such as, for example, photovoltaic devices.

In one aspect, the present disclosure provides an absorbing layer comprising a nanowire comprising at least one of a copper indium selenide, a copper indium gallium selenide, a copper indium sulfide, or a combination thereof.

In another aspect, the present disclosure provides a nanowire comprising at least one of a copper indium selenide, a copper indium gallium selenide, a copper indium sulfide, or a combination thereof, wherein the nanocrystal is capable of being drop-cast, dip-coated, spun-coated, spray-coated, and/or printed onto a substrate.

In yet another aspect, the present disclosure provides a photovoltaic device comprising the absorbing layer described above.

In yet another aspect, the present disclosure provides a method for making a nanocrystal composition, the method comprising any one or more of the steps disclosed herein.

BRIEF DESCRIPTION OF THE FIGURES

The accompanying figures, which are incorporated in and constitute a part of this specification, illustrate several aspects and together with the description serve to explain the principles of the invention.

Figure 1:
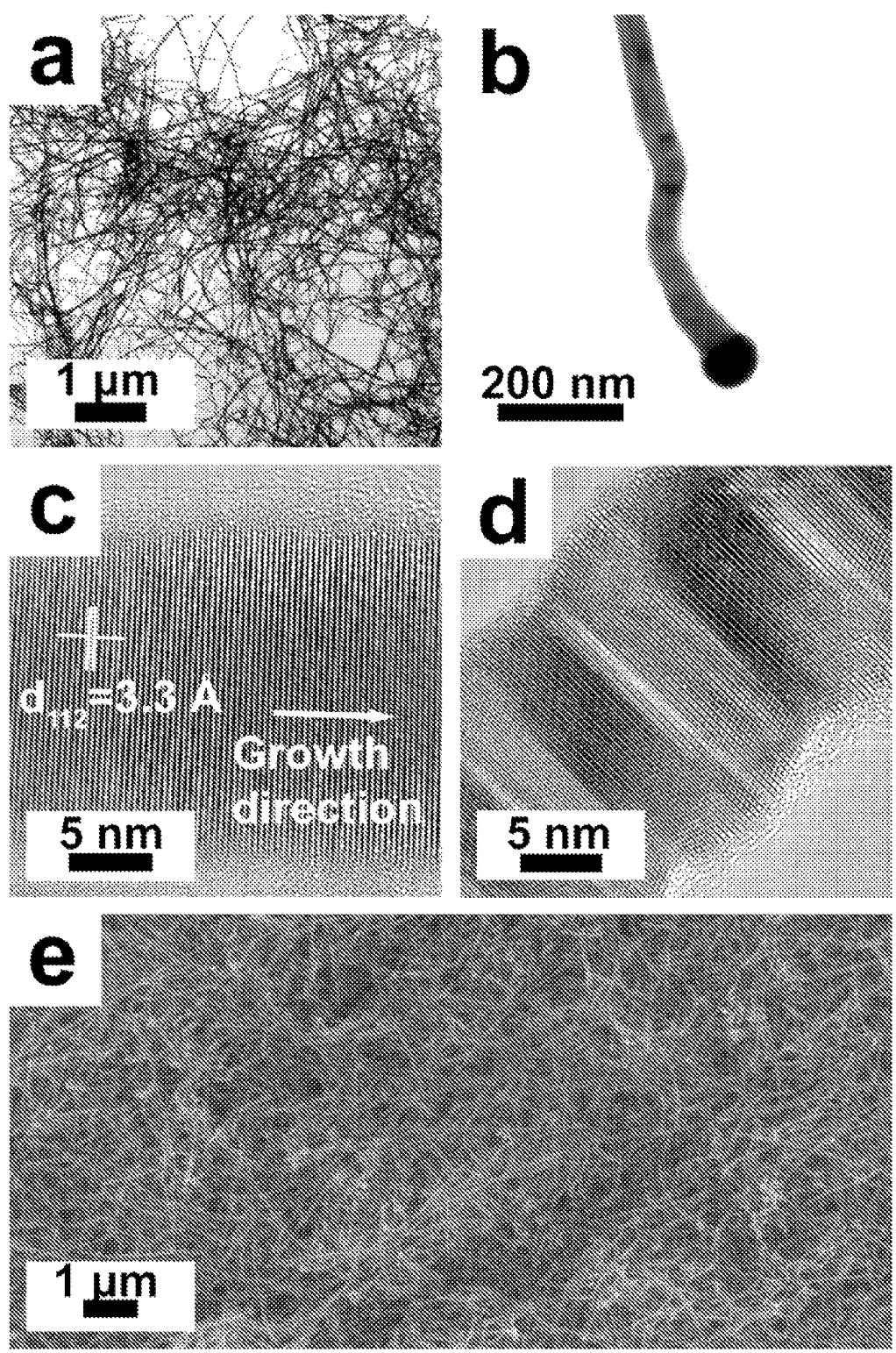
FIG. 1 illustrates: (a and b) transmission electron micrographs, (c and d) high resolution transmission electron micrographs, and a (e) scanning electron micrograph of $CuInSe_2$ nanowires, in accordance with various aspects of the present invention.

Additional aspects of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION

The present invention can be understood more readily by reference to the following detailed description of the invention and the Examples included therein.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

DEFINITIONS

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, example methods and materials are now described.

As used in the specification and the appended claims, the singular forms "a," "an" and "the" include plural referents unless the context clearly dictates otherwise. Thus, for example, reference to "a solvent" includes mixtures of two or more solvents.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" means that the subsequently described event or circumstance can or can not occur, and that the description includes instances where said event or circumstance occurs and instances where it does not.

As used herein, and unless specifically stated to the contrary, the terms "CIS" and "CIGS" are intended to refer to copper indium selenide and related materials, such as, for example, copper indium gallium selenide, copper indium sulfide, and/or combinations thereof. In one aspect, the terms CIS and CIGS can be used interchangeably and embodiments referring to CIS can include CIGS materials and vice-versa.

Similarly, the terms "nanorod" and "nanowire" are intended to refer to CIS and/or CIGS nanomaterials produced by the various methods of the present invention. In various aspects, nanorods and/or nanowires are intended to refer to nanomaterials having a length greater than, or substantially greater than, their width or diameter.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

Each of the materials disclosed herein are either commercially available and/or the methods for the production thereof are known to those of skill in the art.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

In various aspects, the compositions and methods of the present invention can provide CIS and/or CIGS nanomaterials, such as, for example, nanorods and/or nanowires. In one aspect, the invention provides new synthetic routes for the preparation of such CIGS materials. In yet another aspect, the present invention provides applications and uses of the inventive CIGS materials in, for example photovoltaic cells and devices, and/or optoelectronic devices such as, for example, photodetectors.

In another aspect, the present invention provides CIGS compositions that can be printed onto a substrate, such as, for example, a plastic material. In still other aspects, the efficiency of a device comprising an inventive CIGS composition can be improved by reducing and/or eliminating the number of grain boundaries between crystals.

In one aspect, the present invention provides a semiconductor nanowire (NWs). Such nanowires can, in various aspects, provide advantages to nanocrystals (NCs) due to, for example, their geometry. In one an aspect, optically generated charge carriers can travel along the length of a nanowire, potentially increasing minority carrier diffusion lengths and improving device efficiencies.

Vapor-liquid-solid (VLS) growth has been shown to produce quality CIS NWs, but is not appropriate for low cost manufacturing, owing to the high temperature and vacuum requirements. In contrast, solution-liquid-solid (SLS) growth methods utilize milder processing conditions and are more amenable to commercial scale operations.

In one aspect, the inventive methods can provide CIS NWs via a SLS growth mechanism using Bi NCs as seeds.

Nanorods and Nanowires

In one aspect, the nanomaterials of the present invention can comprise a nanorod, a nanowire, or a combination thereof. In one specific aspect, the nanomaterial comprises a nanorod. In another specific aspect, the nanomaterial comprises a nanowire. In yet another specific aspect, the nanomaterials comprises a mixture of nanorods and nanowires.

In another aspect, the nanomaterial of the present invention can comprise an inorganic material, such as, for example, Cu. Other components, such as other inorganic elements and/or organic ligands and/or dopants can, in various aspects, optionally be present. In other aspects, any one or more of the optional components recited herein can be absent from the nanomaterial composition. Materials that can be incorporated into the nanomaterial include, without limitation, indium, gallium, zinc, and selenide, and sulfide. Exemplary nanomaterials or portions thereof can correspond to the formulas $CuInSe_2$, $CuInS_2$, $CuIn_xGa_{1-x}Se_2$, $CuInTe_2$, $CuGaTe_2$, $CuGa_xIn_{1-x}Te_2$, $Cu_2ZnSnS_2$, $Cu_2ZnSnS_4$, $Cu_2ZnSnSe_4$, or $Cu(In_xGa_{1-x})Se_2$, wherein x is a whole number or fraction that can be determined by compositional analysis and generally depends on the stoichiometry of the various starting materials. In one aspect, an inventive nanomaterial can comprise copper indium selenide. In another aspect, an inventive nanomaterial can comprise copper indium gallium selenide. In yet another aspect, an inventive nanomaterial can comprise copper indium sulfide. In still other aspects, an inventive nanomaterial can comprise a mixture of any two or more nanomaterials as described herein.

The composition of a nanomaterial corresponding to a formula, $Cu(In_xGa_{1-x})Se_2$, can comprise various compositional ratios of the elements in the formula. It should be appreciated that the composition of such a nanomaterial can be tuned by adjusting the relative amounts of each element, for example, In and Ga, during synthesis. For example, x can be a whole integer selected from 0 and 1. Or, in the alternative, x can be a fraction (i.e. a number greater than 0 and less than 1). For example, x can be 0.2, 0.3, 0.4, 0.5, 0.6, 0.7, 0.8, or 0.9. Specific examples can include nanomaterials corresponding to the formula, $Cu(In_xGa_{1-x})Se_2$, wherein x is 0, 0.75, 0.50, and 1 as determined by, for example, X-ray diffraction, with corresponding values of 0, 0.79, 0.51, and 1 as determined by, for example, energy-dispersive X-ray spectroscopy. The amount of $Ga_{(1-x)}$ can be determined from x. For example, if x is 0.75, then 1−x is 0.25.

In one aspect, each of the CIS and/or CIGS materials described herein can comprise any suitable composition, such as, for example, those recited above. In another aspect, each of the materials described herein as a CIS or CIGS material can refer to a CIS material, without any traditional CIGS embodiments. In another aspect, each of the materials described herein as a CIS or CIGS material can refer to a CIGS material, without any traditional CIS embodiments. In yet other aspects, reference to a CIS material can include a CIS material without a traditional CIGS embodiment; and reference to a CIGS material can include a traditional CIGS material without a separate CIS component.

Nanomaterials of the present invention can comprise any shape and size appropriate for a desired application, such as, for example, a photovoltaic application. It should be appreciated that nanomaterial shapes can depend on the mode of synthesis, as well as any post-treatment and/or aging. In one aspect, the nanomaterial comprises a wire geometry, such as, for example, a nanowire. In another aspect, the nanomaterial comprises a rod shape, such as, for example, a nanorod. It should be noted that the particular dimensions, for example, length, width, and aspect ratio, of any particular nanomaterial or mixture of nanomaterials can vary, and that the present invention is not intended to be limited to any particular nanomaterial dimensions. In one aspect, a nanowire and/or nanorod can a length on the order of micrometers, for example, about 0.5, 1, 2, 3, 4, 6, 8, 10, 20, 30, or more micrometers. In another aspect, a nanowire and/or nanorod can have a diameter of from about 2 nm to about 200 nm, for example, about 2, 4, 6, 8, 10, 20, 40, 60, 80, 100, 125, 150, 175, or 200 nm. In yet another aspect, a nanowire and/or nanorod can have a diameter of about 20 nm. In still other aspects, a nanowire and/or nanorod can have a length, diameter, and/or aspect ratio greater than or less than any values specifically recited herein, and the present invention is not intended to be limited to any particular length, diameter, and/or aspect ratio.

Solution-Processed $CuInSe_2$ Nanowires

In one aspect, the method of the present invention provides a solution-liquid-solid (SLS) based synthesis of CIS NWs using bismuth (Bi) NCs as catalyst particles. In various aspects, nanowire morphology, phase purity, or a combination thereof can be tailored by control of reaction conditions. One of skill in the art, in possession of this disclosure, could readily determine appropriate reaction conditions to provide nanowires have desirable properties.

In one aspect, CIS and/or CIGS nanowires can be synthesized by contacting a bismuth nanocrystal with one or more of a copper precursor, an indium precursor, a selenium precursor, or a combination thereof. In another aspect, such contacting occurs in a solvent. In yet another aspect, the solvent comprises trioctylphosphine. In other aspects, the solvent can comprise squalane and/or hexadecylamine. In still other aspects, other solvents or combinations of solvents can be utilized to synthesize CIS and/or CIGS nanowires, and the present invention is not intended to be limited to any particular solvent. In one aspect, the solvent can be a high boiling point solvent. One of skill in the art, in possession of this disclosure, could readily determine an appropriate solvent for synthesizing a CIS and/or CIGS nanowire in accordance with the various methods of the present invention.

In another aspect, a CIS and/or CIGS nanowire can be synthesized by first contacting a bismuth nanocrystal with a solvent, and then contacting with one or more precursor materials described above. In yet another aspect, contacting a bismuth nanocrystal with a solvent can form a solution that is subsequently mixed with one or more precursor materials. In one aspect, a selenium precursor can comprise selenium and trioctylphosphine. In another aspect, a copper precursor can comprise copper acetate. In still another aspect, an indium precursor can comprise indium acetate. In any of the various methods recited herein, the order of addition and/or mixing of any two or more components can vary, and the disclosure is not intended to be limiting as to any particular order of addition and/or mixing.

In an exemplary aspect, a copper precursor and an indium precursor can be contacted with a solvent, such as, for example, trioctylphosphine (TOP), and optionally a surfactant or emulsifier, such as, for example, oleic acid. The resulting solution can optionally be stirred and/or heated, for example, under vacuum. In such an aspect, a separate TOP solution comprising a selenium precursor can be prepared and then be mixed with the copper and indium containing solution. In a reaction vessel containing hot solvent, a quantity of Bi NCs can be added, followed by the mixed selenium and copper/indium solution. In such an aspect, the inventive NWs can form as a precipitate in the reaction vessel and can optionally be washed one or more times with, for example, toluene.

In another aspect, the solvent, such as, for example, trioctylphosphine, or the combination of solvent, bismuth nanocrystal, and/or one or more precursor materials can be provided at a temperature sufficient to ensure at least partial reaction and thus, form the desired CIS and/or CIGS nanowire. In another aspect, the solvent, bismuth nanocrystal, precursor material, or any combination thereof can be heated such that a nanowire is formed. It should be understood that the specific reaction temperature needed for formation of a nanowire can vary with, for example, the specific solvent, bismuth nanocrystal, and/or precursor material. In one aspect, such as, for example, when using trioctylphosphine, the solvent and/or the combination of reactants can be heated to a temperature of at least about 360° C. In another aspect, the solvent and/or combination of reactants can be heated to a temperature of at least about 270° C. In various aspects, the specific temperature needed to form a nanowire in accordance with the inventive methods described herein can be at least about 250° C., 260° C., 270° C., 280° C., 290° C., 300° C., 320° C., 340° C., 360° C., 380° C., 400° C., or more. One of skill in the art, in possession of this disclosure, could determine an appropriate temperature so as to form a desired nanowire.

In one aspect, reducing the reaction temperature can result in less wurtzite phase being present in the resulting material than a comparable material produced at a higher temperature.

In still another aspect, contacting of the solvent, bismuth nanocrystal, and one or more precursor materials can be performed in an inert and/or oxygen-free atmosphere.

In one aspect, CIS nanowires can be synthesized by injecting Bi NCs and a precursor solution containing Cu, In, and Se into hot trioctylphosphine (TOP).

FIG. 1 illustrates transmission electron microscopy (TEM), high-resolution transmission electron microscopy (HRTEM) and scanning electron microscopy (SEM) images of a CIS NW sample, prepared in accordance with the various methods of the present invention. In one aspect, the majority of the NWs produced can be several microns in length, as illustrated in FIG. 1a. FIG. 1b illustrates a wire growing out of a Bi seed, providing evidence of SLS growth. A control experiment in which no Bi NCs were injected produced only agglomerated CIS material. Such data reinforces the presence of a SLS growth mechanism. In another aspect, the Bi seed illustrated in FIG. 1 is substantially larger than the average size of the as-synthsized NCs (~12 nm), indicating coalescence of particles during the reaction.

FIGS. 1c and 1d illustrate single CIS NWs under high magnification to illustrate the growth direction of the wires and the existence of substantial twinning along the length of the wire. In another aspect, analysis of the lattice spacing reveals growth in a direction perpendicular to the (112) planes. The zig-zag pattern of the NW illustrated in FIG. 1d is representative of twinning, and is seen in virtually all NWs. In one aspect, the average composition of the nanowires, as determined by energy-dispersive X-ray spectroscopy (EDS), is about $Cu_{1.0}In_{0.6}Se_{2.0}$, indicating that the NWs can contain stoichiometric copper and selenium but are indium-deficient. In such an aspect, the SEM image of FIG. 1e illustrates a field of wires deposited onto a gold coated substrate, illustrating what the absorber film looks like in the PV test devices described below.

Figure 2:
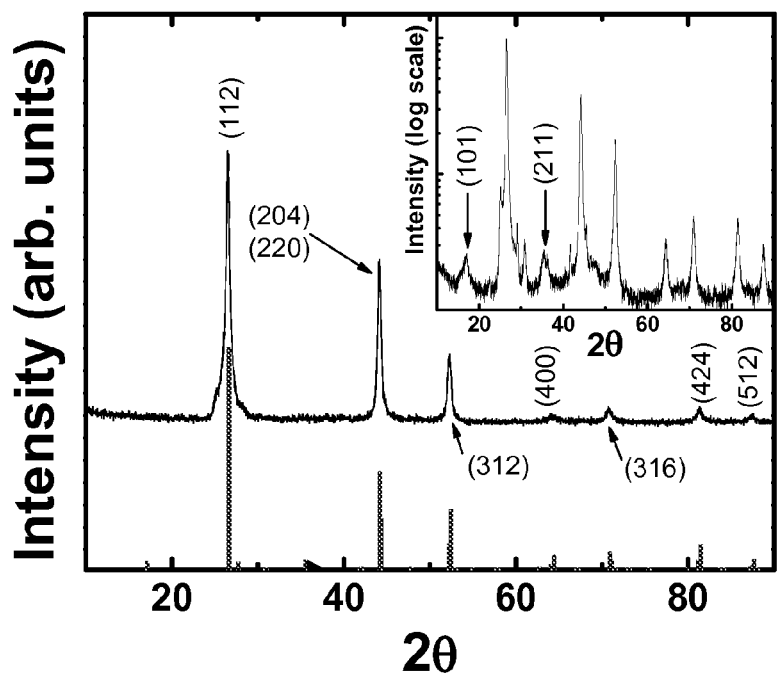
FIG. 2 illustrates x-ray diffraction patterns of CIS nanowires synthesized with $InCl_3$ in trioctylphosphine (TOP) or indium acetate in squalane, in accordance with various aspects of the present invention. The inset is plotted on a logarithmic scale to elucidate the (101) and (211) peaks. The reference pattern corresponds to chalcopyrite CIS (JCPDS no. 97-006-8928).

In one aspect, X-ray diffraction (XRD) analysis (FIG. 2) illustrates that the inventive NWs comprise CIS. In one aspect, the inventive material can comprise chalcopyrite CIS. In another aspect, the inventive material can comprise compositionally disordered sphalerite phase. In yet another aspect, the inventive material can comprise other components and/or can comprise a mixture of two or more components, such as, for example, chalcopyrite CIS and compositionally disordered sphalerite phase. Chalcopyrite CIS has additional reflections—the (101) and (211) planes—that do not appear in the diffraction pattern of sphalerite. In one aspect, the intensity of these two peaks is low, making it difficult to distinguish between the two patterns. In one exemplary aspect, a sample, synthesized at 400° C. in squalane rather than TOP, exhibited a pattern where these two peaks could clearly be seen (FIG. 2 inset). In one aspect, the diffraction pattern illustrated in FIG. 2 is from NWs made with $InCl_3$, and was shown for clarity. In various other aspects, varying reaction conditions, precursors, and surfactants can be utilized to produce CIS NWs exhibiting other diffraction peaks, indicating the presence of one or more additional phases.

Figure 3:
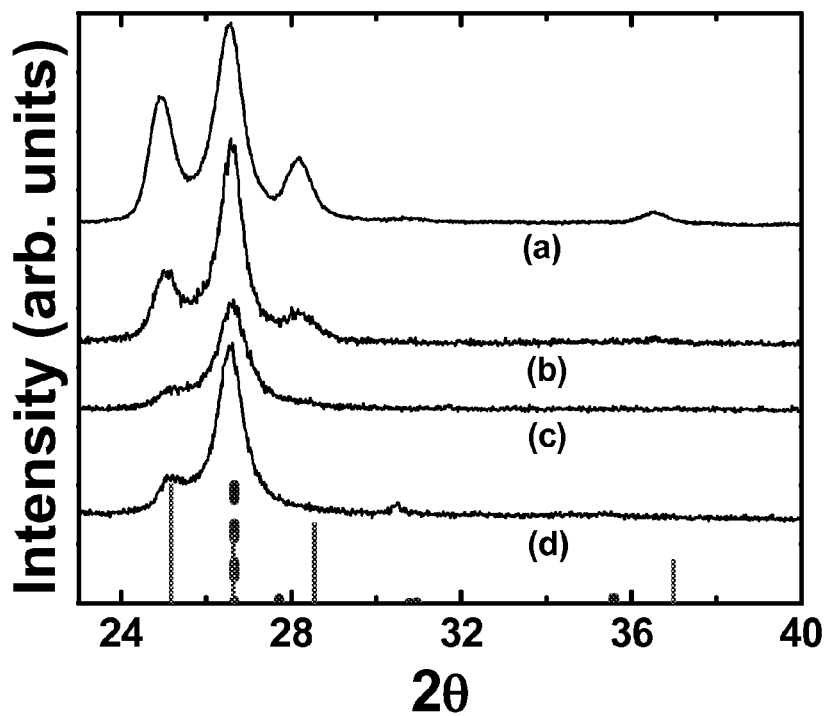
FIG. 3 illustrates x-ray diffraction patterns of CIS nanowires synthesized at (a) 400° C., (b) 360° C., (c) 270° C., and (d) 360° C. with hexadecylamine (HDA), in accordance with various aspects of the present invention. The dashed reference pattern corresponds to chalcopyrite CIS (JCPDS no. 97-006-8928) and the other reference pattern was simulated with CaRIne Crystallography 3.1 software using space group $P6_3mc$ and lattice parameters a=4.08 Å and c=6.69 Å.

In one aspect, FIG. 3 illustrates XRD patterns of CIS NWs synthesized under varying temperatures (a,b,c) or with hexadecylamine (HDA) added (d). In another aspect, several samples of NWs exhibited extra peaks at ~25°, 28°, and 37°2θ. In one aspect, this impurity can be attributed to a $Cu_3Se_2$ phase. Thus, in one aspect, an inventive CIS material can comprise a $Cu_3Se_2$ phase. Such a secondary phase can be present, for example, in small quantities. In another aspect, the peak observed at 37° can be attributed to wurtzite $CuInSe_2$ (FIG. 3). Wurtzite is a thermodynamically unfavorable phase at room temperature in bulk CIS, but has been shown to exist on the nano-scale. Thus, in one aspect, an inventive CIS material comprises a wurtzite phase.

In another aspect, as the reaction temperature is reduced, the intensity of the wurtzite peaks, and thus, wurtzite concentration, can be diminished (FIG. 3). In another aspect, the presence of a surfactant, such as, for example, HDA, can affect the phase by, for example, reducing wurtzite formation. In one aspect, a surfactant is present in the reaction mixture. In another aspect, a surfactant is not present in the reaction mixture. A surfactant, if present, can comprise any surfactant suitable for use in the reaction, and one of skill in the art could readily select an appropriate surfactant.

In one aspect, the choice of precursor can also affect wurtzite formation. In one aspect, CIS NWs made with $InCl_3$ rather than indium acetate do not exhibit the presence of a wurtzite phase (FIG. 2). In another aspect, the use of an $InCl_3$ precursor can significantly affect nanowire morphology. In one aspect, a precursor comprises $InCl_3$. In another aspect, a precursor comprises indium acetate. In another aspect, a precursor comprises other indium containing compounds and/or a mixture of compounds.

Figure 4:
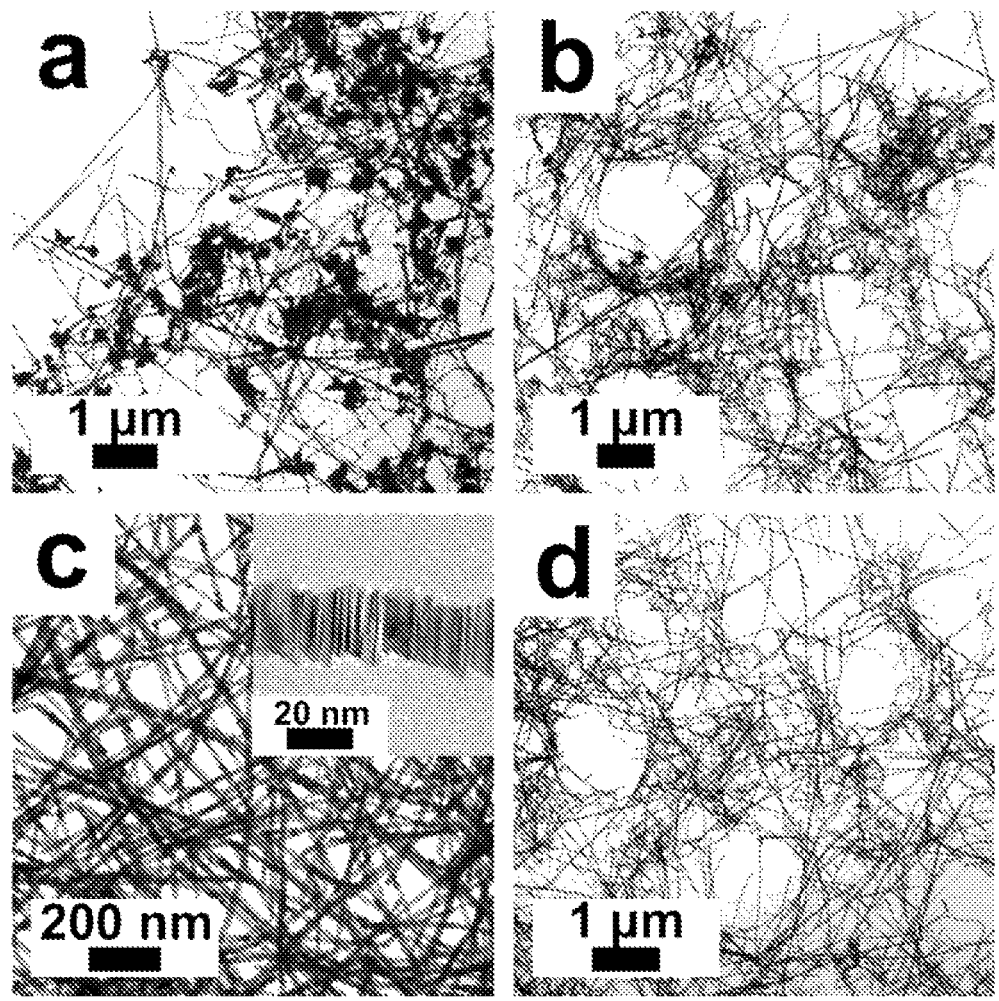
FIG. 4 illustrates low resolution and high resolution (c, inset) transmission electron micrographs of CIS nanowires, in accordance with various aspects of the present invention.

In one aspect as noted above, synthesis of NWs at 400° C. in squalane can produce chalcopyrite CIS. As illustrated in FIG. 4a, the reaction products in such conditions can be a mixture of NWs and agglomerated material. In yet another aspect, nanowire morphology can be improved at 400° C. when the solvent is a 50/50 mixture of TOP and squalane (b). In such an aspect, a small quantity of agglomerated material can optionally remain. In still other aspects, the nanomaterials can comprise no or substantially no agglomerated material. In another aspect, if $InCl_3$ is used as a precursor, phase-pure tetragonal CIS (FIG. 2) materials can be produced. In such an aspect, the produced NWs can optionally comprise a sawtooth morphology (FIG. 4c and inset). In yet another aspect, nanowires synthesized at 360° C. with a surfactant, such as, for example, HDA, can provide smooth (FIG. 4d) nanowires having low concentrations of wurtzite phase (FIG. 3, pattern d).

In one aspect, the band-gap energy determined from the absorbance spectrum of a nanowire dispersion (FIG. 5, inset) can be approximately 1 eV, matching the bulk literature value of 0.95-1.05 eV for CIS.

Figure 5:
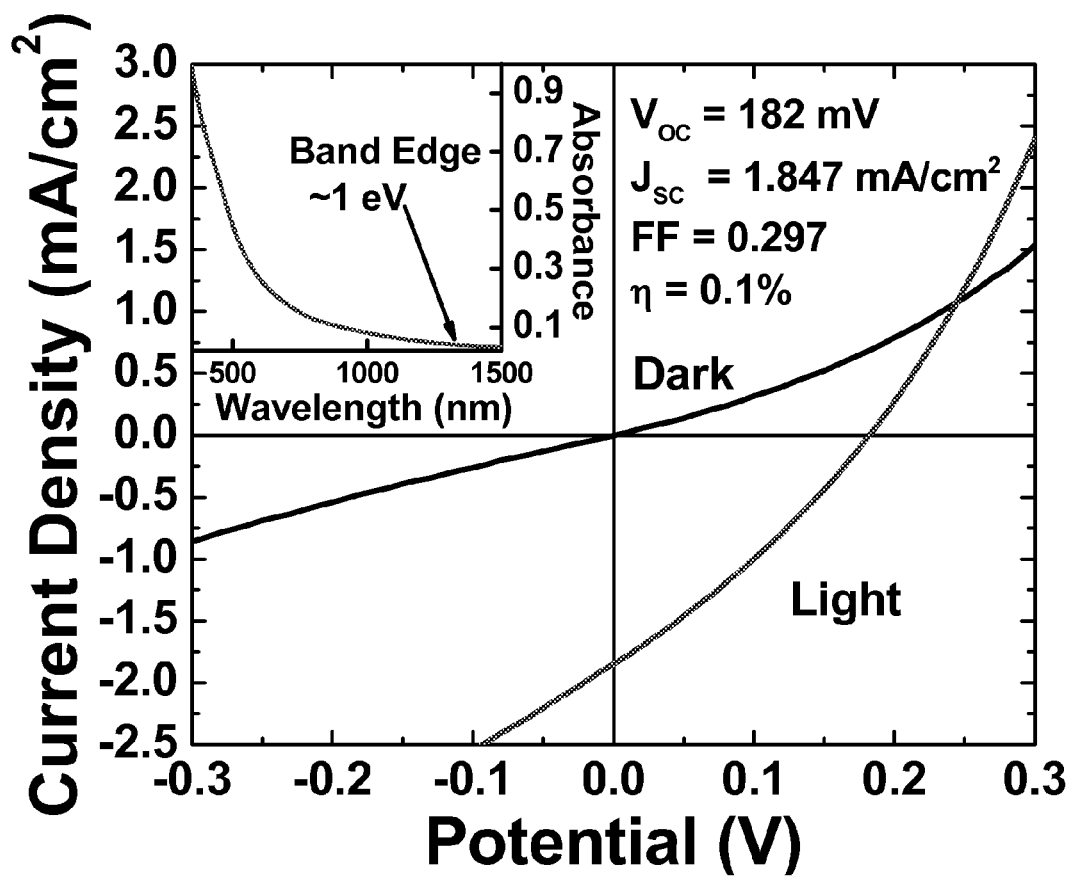
FIG. 5 illustrates the current voltage characteristics of a CIS nanowire photovoltaic device, in accordance with various aspects of the present invention. The inset illustrates the room temperature UV-vis-NIR absorbance spectrum of CIS nanowires dispersed in toluene.

In another aspect, photovoltaic test devices can be fabricated using CIS NWs with, for example, a layered structure composed of Au/CIS NWs/CdS/ZnO/indium tin oxide (ITO). In one aspect, a CIS layer can be created by spray coating a dispersion of NWs in toluene. FIG. 5 illustrates the PV response of a typical test device having an open-circuit voltage ($V_{OC}$) of 182 mV, a short-circuit current density ($J_{SC}$) of 1.847 mA/cm$^2$, a fill factor (FF) of 0.297, and PCE (ii) of 0.1% under AM 1.5 illumination conditions. Although the PCE is low, this device shows that, in various aspects, solution-processed CIS NWs can be useful as a PV material.

In one aspect, as compared to conventional CIS PVs, the $V_{OC}$ and FF of a device prepared with the inventive compositions are low, due to, for example, low shunt resistance. In one aspect, inherent defects in the CIS NWs can contribute to the device characteristics. For example, twinning in NWs has been shown to be detrimental to carrier transport. In another aspect, vacancies in the crystal lattice of the NWs due to indium deficiency can inhibit device performance. In one aspect, the methods of the present invention can provide phase—pure and stoichiometric chalcopyrite CIS NWs with no twinning. In other aspects, the production of such materials can be achieved with better PCEs by, for example, varying reaction parameters and utilizing different precursors and ligands. One of skill in the art, in possession of this disclosure, could readily determine appropriate reaction parameters, precursors, and ligands, so as to achieve a desired result.

In one aspect, CIS NWs can be synthesized by SLS growth using Bi NCs as seeds. In another aspect, phase purity can be dependent on reaction temperature and/or the presence of surfactants such as hexadecylamine. In another aspect, nanowire morphology can be affected by reaction temperature and/or solvent and precursor choice.

In one aspect, the inventive materials, layers, and devices can be prepared without annealing or chemically treating, for example, an absorber layer. In one aspect, no annealing or chemical treatment step is performed. In another aspect, an annealing step and/or a chemical treatment step can be performed on, for example, an absorber layer, so as to provide improved efficiency.

Devices Comprising CIGS Nanomaterials

The nanorods and nanowires of the present invention can be incorporated into electronic and photonic devices, such as, for example, a photovoltaic device. An exemplary photovoltaic device is a solar cell. The absorber layer in a solar cell, for example, can comprise one or more nanowires as disclosed herein. Other devices that can utilize the nanorods and nanowires of the present invention include printable electronic applications, such as transistors and photodetectors. In one aspect, a device can be constructed, wherein one or more nanowires can be utilized to fabricate, a film or layer.

A nanowire composition as disclosed herein, for example, can be used as a layer in a photovoltaic device. Such a device could be flexible, for example, if a nanowire layer were coated onto a flexible substrate, such as, for example, plastic.

A stoichiometry controlled absorber layer can be created for use with a photovoltaic device by controlling nanocrystal stoichiometry (i.e. the relative amounts of the materials making up the nanoparticle). A photovoltaic device could comprise, for example, a nanocrystal layer with a composition gradient. A film with a $Ga_xIn_{1-x}$ concentration gradient, for example, could be created such that x varies from about 0 to about 1 through the film.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Unless specifically stated to the contrary, all of the following chemicals were used as received: tetrahydrofuran (THF, anhydrous, ≥99.9%, inhibitor-free), sodium bis(trimethylsilyl)amide (Na[N(SiMe$_3$)$_2$], 1.0 M in THF), bismuth chloride (BiCl$_3$, ≥98%), diphenyl ether (DPE, 99%), copper (I) acetate (97%), indium (III) acetate (99.99%), indium (III) chloride (InCl$_3$, 99.999%), elemental selenium (Se, 99.99%), trioctylphosphine (TOP, 90%), oleic acid (OA, 99%), squalane (99%), and 1-hexadecylamine (HDA, 90%) were obtained from Aldrich; methanol (MeOH), toluene, and hexane from Fisher Scientific; and polyvinylpyrrolidone-hexadecane (PVP-HDE) copolymer (Ganex V-216, MW=7,300 g/mol, product ID 72289D) from ISP Technologies, Inc.

Bismuth Nanocrystal Synthesis

Tris[bis(trimethylsilyl)amino]bismuth (Bi[N(SiMe$_3$)$_2$]$_3$) precursor was synthesized by known methods and dissolved in THF to make a 1 M solution. 5 g of polyvinylpyrrolidone-hexadecane copolymer (Ganex V216) and 15 g of diphenyl ether were then combined in a 100 mL three-neck flask. The flask was attached to a Schlenk line, placed under vacuum, heated to 70° C., and allowed to degas for about 1.5 hrs while stirring. In parallel, 0.5 mL of Bi[N(SiMe$_3$)$_2$]$_3$/THF was mixed with 2.0 mL of 1 M NaN(SiMe$_3$)$_2$ in THF and placed into a syringe. After the Ganex V216 and diphenyl ether solution was degassed, the flask was refilled with N$_2$ and the temperature increased to 180° C. At 180° C., the Bi precursor solution was quickly injected into the hot solution and reacted for 30 min. After 30 min., the mixture was cooled to 60° C. and 15 mL of room-temperature toluene was added.

Figure 6:
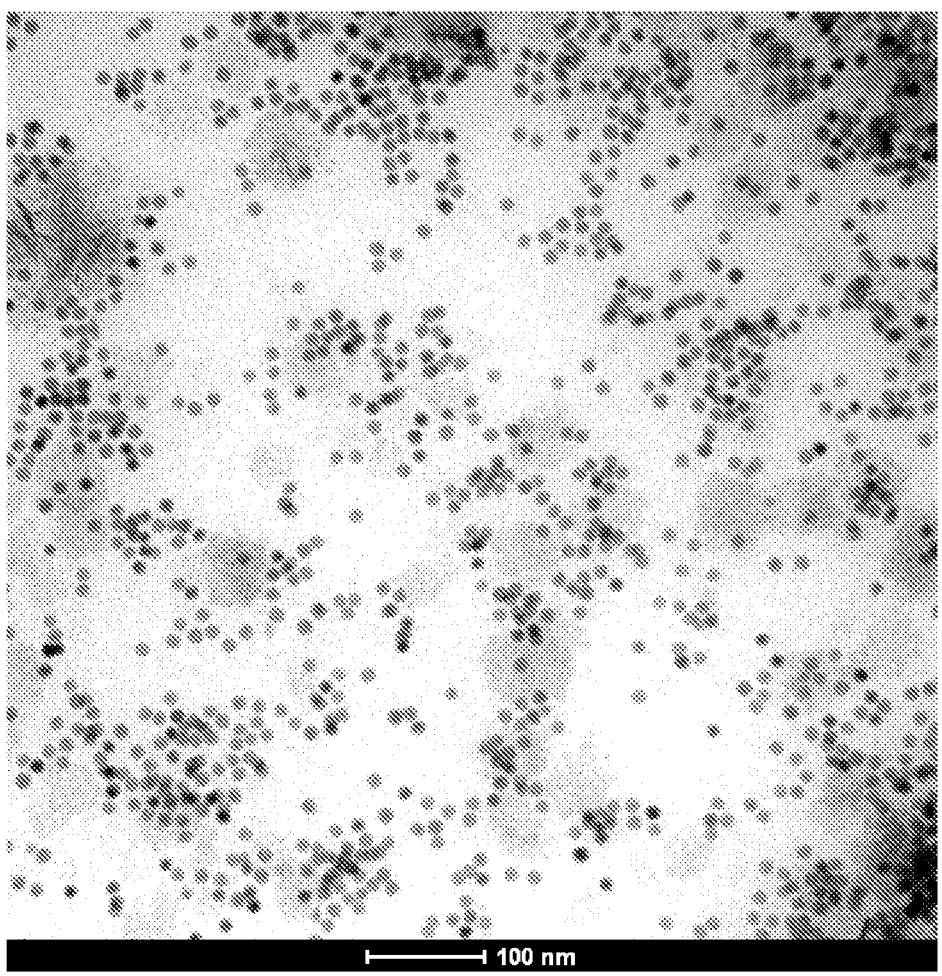
FIG. 6 illustrates a transmission electron micrograph of bismuth nanocrystals, in accordance with various aspects of the present invention.

To clean and isolate the Bi nanocrystals, the reaction products were centrifuged for 3 min at 5,000 RPM. The precipitate was discarded, and about 30 mL MeOH was added to the supernatant, and centrifuged for 5 min at 10,000 RPM. The supernatant was then discarded and the precipitate dispersed in ~10 mL toluene. This process was repeated several times and the final precipitate was dispersed and stored in toluene at a concentration of 5 mg/mL. This reaction produced spherical Bi NCs with an average diameter of 12.7±0.9 nm, as illustrated in FIG. 6.

CuInSe$_2$ Nanowire Synthesis

A 1 M stock solution of Se in TOP (TOP:Se) was made by dissolving 1.58 g of Se powder in 20 mL of TOP. This solution was prepared in a glovebox under an inert atmosphere, stirred overnight to ensure that the Se was completely dissolved, and stored in the same glovebox.

In a typical reaction, 30.6 mg of copper acetate (0.25 mmol), 70.3 mg of indium acetate (0.25 mmol), 0.25 mL of OA, and 4 mL of TOP were combined in a 25 mL three-neck flask. The flask was attached to a Schlenk line and degassed while heating to 100° C. After reaching 100° C., the solution was held under vacuum for 15 minutes and stirred vigorously. The flask was then filled with N$_2$ and cooled to room temperature under N$_2$ flow.

In a separate 50 mL three-neck flask, 8.5 mL of TOP was added, attached to the Schlenk line, and degassed under vacuum at room temperature for 5 minutes. The TOP was heated to 360° C. under $N_2$ flow (this describes a typical reaction; other temperature, solvent, and precursor combinations were tried as described in the paper).

The Cu and In precursor solution was then combined with 0.5 mL of the 1 M TOP:Se stock solution and placed in a syringe. To initiate the reaction, 0.25 mL of a 5 mg/mL solution of Bi nanocrystals in toluene was swiftly injected into the hot TOP, followed immediately by the Cu, In, and Se precursor solution. The reaction mixture immediately turned from a light yellow color to dark brown with some black precipitate forming. The reaction proceeded for 5 minutes followed by removal of the heating mantle, allowing the products to cool to ~50° C.

10 mL of toluene was then injected into the flask, after which this solution was removed from the Schlenk line. To separate and clean the products, this mixture was centrifuged at 4,000 RPM for 5 min. The supernatant was discarded and the precipitate redispersed in 30 mL of toluene. This cleaning procedure was repeated three times and the final product was redispersed in ~10 mL of toluene.

Nanowire Film Deposition and Photovoltaic Device Fabrication

PV test devices were fabricated on soda lime glass substrates with a layered structure composed of Au/CIS NW/CdS/ZnO/indium tin oxide (ITO). Gold back contacts were deposited by thermal evaporation. CIS nanowires were deposited by spray coating from a toluene dispersion. The CdS buffer layer was deposited by chemical-bath deposition. Substrates were placed on a hot plate at 90° C., and then 0.9 mL of an aqueous solution of 1.25 mL of 0.015 M $CdSO_4$ (Aldrich, 99.999%), 2.2 mL of 1.5 M thiourea (Fluka, 99%), and 2.8 mL, of 14.28 M $NH_4OH$ (Fisher Scientific, Certified ACS) was placed on the substrate. After 2 min, the substrates were rinsed with de-ionized water and dried in air. ZnO/ITO top contacts were deposited by rf sputtering from ZnO (99.9%, Lesker) and ITO (99.99% 90:10 $In_2O_3/SnO_2$, Lesker) targets. The active region of the device was 8 $mm^2$.

Materials Characterization.

Transmission electron microscopy (TEM) images were obtained on 200 mesh carbon-coated Ni grids (Electron Microscopy Sciences) using a FEI Tecnai Spirit BioTwin operated at 80 kV. High-resolution transmission electron microscopy (HRTEM) images and energy-dispersive X-ray spectroscopy (EDS) data were obtained using a JEOL 2010F transmission electron microscope operated at 200 kV and equipped with an Oxford INCA EDS detector. Scanning electron microscopy (SEM) images were obtained using gold-coated soda lime glass substrates with a Zeiss Supra 40 VP scanning electron microscope operated at 1-10 keV.

X-ray diffraction (XRD) data were acquired on a Bruker-Nonius D8 Advance powder diffractometer using Cu Kα radiation ($\lambda$=1.54 Å) with samples on quartz substrates, scanning at 12 deg/min in 0.02° increments.

PV devices were tested on a Karl Suss probe station and an Agilent 4156C parameter analyzer. J-V data and power conversion efficiencies were obtained using a Keithley 2400 General Purpose Source meter and a Xenon Lamp Solar Simulator (Newport) with an AM 1.5 filter.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A nanowire or nanorod comprising a CIS material having the formula $Cu_{1.0}In_{0.6}Se_{2.0}$, wherein the nanowire or nanorod is capable of being printed onto a substrate.

2. The nanowire or nanorod of claim 1, wherein the material exhibits no or substantially no twinning.

3. The nanowire or nanorod of claim 1, wherein the material is comprised of a single phase.

4. The nanowire or nanorod of claim 1, comprising a chalcopyrite CIS.

5. The nanowire or nanorod of claim 1, comprising a disordered sphalerite phase.

6. The nanowire or nanorod of claim 1, comprising no or substantially no agglomerated material.

7. A layered structure comprising the nanowire or nanorod of claim 1.

8. The layered structure of claim 7, wherein at least one layer disposed therein comprises the nanowire or nanorod.

9. The layered structure of claim 8, wherein the at least one layer is optically absorbing.

10. The layered structure of claim 8, wherein the at least one layer has a composition gradient through at least a portion of the at least one layer.

11. The layered structure of claim 7, wherein the structure is flexible.

12. The layered structure of claim 7, having a Au/CIS NW/CdS/ZnO/ITO structure.

13. A photovoltaic device comprising the nanowire or nanorod of claim 1.

14. A photovoltaic device comprising the layered structure of claim 7.

15. A photodetector comprising the nanowire or nanorod of claim 1.

* * * * *